(12) United States Patent
Kreibich

(10) Patent No.: US 7,368,912 B2
(45) Date of Patent: May 6, 2008

(54) CONFIGURATION FOR NUCLEAR MAGNETIC RESONANCE IMAGING (MRI) WITH AN MRI PHANTOM

(75) Inventor: Wolfgang Kreibich, Ettlingen (DE)

(73) Assignee: Bruker Biospin MRI GmbH, Ettlingen (DE)

( * ) Notice: Subject to any disclaimer, the term of this patent is extended or adjusted under 35 U.S.C. 154(b) by 0 days.

(21) Appl. No.: 11/506,798

(22) Filed: Aug. 21, 2006

(65) Prior Publication Data
US 2007/0069725 A1  Mar. 29, 2007

(30) Foreign Application Priority Data
Sep. 24, 2005 (DE) .................. 10 2005 045 679

(51) Int. Cl.
*G01V 3/00* (2006.01)
(52) U.S. Cl. ...................... 324/307; 324/318
(58) Field of Classification Search ......... 324/300–322
See application file for complete search history.

(56) References Cited

U.S. PATENT DOCUMENTS

| | | | |
|---|---|---|---|
| 4,818,943 A | 4/1989 | Chandra | |
| 4,888,555 A | 12/1989 | Vaughan et al. | |
| 5,005,578 A * | 4/1991 | Greer et al. | 600/414 |
| 5,036,280 A | 7/1991 | Chesavage | |
| 6,605,942 B1 * | 8/2003 | Warren | 324/307 |
| 7,042,220 B2 * | 5/2006 | Truong et al. | 324/309 |
| 7,078,015 B2 * | 7/2006 | Unger | 424/9.52 |
| 7,218,109 B2 * | 5/2007 | Campagna | 324/309 |
| 2002/0150539 A1 * | 10/2002 | Unger | 424/9.52 |
| 2005/0077459 A1 * | 4/2005 | Engler et al. | 250/252.1 |

FOREIGN PATENT DOCUMENTS

| | | |
|---|---|---|
| DE | 93 14 691 | 4/1994 |
| GB | 2 209 401 | 5/1989 |

OTHER PUBLICATIONS

Hua Hsuan Chen, B.S. "Quality Assessment of high spatial resolution for MRI" (http://ric.uthscsa.edu/personalpages/-lancaste/DI2_Projects_2003/QA_MRI.pdf).
Siemens AG "Magnetom Trio" (http://www.pc.rhul.ac.uk/vision/Restricted/Siemens/-system_trio.pdf).
Geoffrey D. Clarke, Ph.D. "AAPM Summer School 2001" (http://www.aapm.org/meetings/2001SS/presentaitons/clarke_MRI%20-Troubleshooting.pdf).

* cited by examiner

*Primary Examiner*—Brij Shrivastav
*Assistant Examiner*—Dixomara Vargas
(74) *Attorney, Agent, or Firm*—Paul Vincent

(57) ABSTRACT

An MRI configuration comprising an MRI phantom positioned in a volume under investigation, wherein the MRI phantom has a chamber disposed in a housing and filled with a liquid, in which a gas bubble forms, the liquid nuclei which have an NMR relaxation time $T_1$ of between 100 ms and 20 s, is characterized in that the chamber the MRI phantom a main chamber and a partial chamber, the main chamber being delimited from the partial chamber such that the gas bubble can completely enter the partial chamber due to its buoyancy by changing the spatial orientation of the MRI phantom in the gravitation field, and remains in the partial chamber in a measurement orientation of the MRI phantom due to its buoyancy. This eliminates imaging artefacts despite the presence of a gas bubble.

19 Claims, 5 Drawing Sheets

CONFIGURATION FOR NUCLEAR MAGNETIC RESONANCE IMAGING (MRI) WITH AN MRI PHANTOM

This application claims Paris Convention priority of DE 10 2005 045 679.0 filed Sep. 24, 2005 the complete disclosure of which is hereby incorporated by reference.

BACKGROUND OF THE INVENTION

The invention concerns a nuclear magnetic resonance imaging (MRI) configuration with a magnet system for generating a homogeneous magnetic field $B_0$ in a volume under investigation, a radio frequency (RF) system for generating an RF field $B_1$ in the volume under investigation or for detecting an RF field $B_1$ from the volume under investigation, with a gradient system for temporarily superposing defined gradient fields on the magnetic field $B_0$, and an MRI phantom positioned in the volume under investigation, which aids in determining the homogeneity of the magnetic field $B_0$ and/or the RF field $B_1$ and/or the linearity and/or intensity and/or scaling of the gradient fields in the volume under investigation, wherein the NMR phantom comprises a chamber which is disposed in a housing and filled with a liquid, in which a gas bubble forms, wherein the liquid contains nuclei having an NMR relaxation time $T_1$ of between 100 ms and 20 s.

The company Siemens AG distributes such a configuration e.g. under the name "MAGNETOM Trio"

(http://www.pc.rhul.ac.uk/vision/Restricted/Siemens/-system_trio.pdf).

In order to ensure constant quality of MRI recordings, the above-mentioned properties of the magnetic fields ($B_0$ field, $B_1$ field, and gradient fields) must be tested. A substance is required in order to perform these tests, which is disposed in the image plane in a homogeneous or structured fashion. A hollow body (MRI phantom) filled with a suitable liquid is generally used for this purpose.

When filling liquid into a hollow MRI phantom body, a gas bubble generally forms which can produce imaging artefacts. If the gas bubble is e.g. in the recording plane, no signal is detected in the region of the gas bubble. Moreover, the switching of gradients during MRI recording can cause vibrations of the gas bubble and thereby pressure waves within the liquid in the MRI phantom which produces signal variations within the image plane and thereby artefacts. These problems are known and were discussed e.g. in "Quality Assessment of high spatial resolution for MRI"

(http://ric.uthscsa.edu/personalpages/-lancaste/ DI2_Projects_2003/QA_MRI.pdf) and "AAPM Summer School 2001"

(http://www.aapm.org/meetings/2001ISS/presentations/ clarke_MRI%20-Troubleshooting.pdf). For this reason, MRI phantoms are regularly refilled in order to minimize gas bubble formation.

Despite such measures to avoid formation of gas bubbles during filling of such MRI phantoms, the liquid may nevertheless be pressed through the seal of the filler neck of the MRI phantom (leakage) when temperatures increase or the hollow body may burst. If there is a gas bubble within the MRI phantom, the compressibility of the gas can compensate for pressure fluctuations. For this reason, the presence of gas bubbles is sometimes even desired, in particular, when liquids containing harmful substances are used.

It is the underlying purpose of the present invention to propose an MRI configuration with an MRI phantom, which avoids imaging artefacts despite the presence of a gas bubble.

SUMMARY OF THE INVENTION

This object is achieved in accordance with the invention in that the chamber comprises a main chamber and a partial chamber, wherein the main chamber is delimited from the partial chamber such that the gas bubble can completely enter the partial chamber due to its buoyancy by changing the spatial orientation of the MRI phantom in the gravitation field, and remains in the partial chamber in a measurement orientation of the MRI phantom due to its buoyancy.

In this fashion, MRI recordings can be performed outside of the partial chamber without disturbing influences by gas bubbles, at the same time ensuring pressure compensation with possible temperature increase. Direct artefacts due to lack in signal intensity in the region of the gas bubble and transmission of vibrations from the gas bubble to the liquid in the MRI phantom are minimized by the inventive configuration. The sizes of the gas bubble and partial chamber should be selected such that the gas bubble can be completely accommodated in the partial chamber.

This is particularly advantageous for an MRI configuration, wherein the magnet system comprises a cryostat with horizontal room temperature bore, which houses the volume under investigation. In such applications, the measuring planes are mostly vertical, such that, in MRI configurations with conventional MRI phantoms, the gas bubble is directly in the center plane causing great disturbances that are prevented by using the inventive configuration.

The invention also concerns an MRI phantom for use in an MRI configuration as described above, which determines the homogeneity of the magnetic field $B_0$ and/or the RF field $B_1$ and/or the linearity and/or intensity and/or scaling of the gradient fields in the volume under investigation of the MRI configuration, wherein the MRI phantom comprises a chamber which is disposed in a housing and filled with a liquid, in which a gas bubble forms, wherein the liquid contains nuclei having an NMR relaxation time T1 of between 100 ms and 20 s. In the inventive MRI phantom, the chamber comprises a main chamber and a partial chamber, wherein the main chamber is delimited from the partial chamber such that the gas bubble can completely enter the partial chamber through changing the spatial orientation of the MRI phantom in the gravitation field due to its buoyancy and remains in the partial chamber in a measurement orientation of the MRI phantom due to its buoyancy, the partial chamber having a smaller volume than the main chamber.

An MRI phantom of this type only comprises a small dead volume (partial volume containing the gas bubble) such that, despite the compact design, recordings can be performed in the largest part of the chamber, i.e. the main chamber, without disturbances. The limitation of the partial chamber also largely suppresses disturbances in the main chamber caused by vibrations due to the gas bubble located in the partial chamber.

In a particularly preferred embodiment of the inventive MRI phantom, a barrier is provided in the chamber which partially delimits the partial chamber from the main chamber. The gas bubble can be kept removed from the measuring plane by such a barrier.

In a further development of this invention, the barrier comprises a wall with an opening. The opening is thereby disposed such that the gas bubble can enter into the partial chamber in one orientation of the MRI phantom, and remains in the partial chamber in the measurement orientation of the MRI phantom. The size of the opening must thereby be selected such that the gas bubble can enter the partial chamber despite adhesive forces.

In one particular embodiment, the barrier comprises a wall which merely extends over part of a cross-section of the chamber. Orientation of the MRI phantom in order to introduce the gas bubble into the partial chamber is facilitated in this embodiment.

The housing of the chamber is preferably cylindrical, in particular, circularly cylindrical. A slight deviation from an ideal cylinder shape, e.g. due to filler necks, holders or lids, does not influence the function of the MRI phantom.

The main chamber and partial chamber are preferably mutually offset in an axial direction. The gas bubble is kept on the side of the main chamber.

With particular preference, the partial chamber is disposed on an axial end of the housing. The MRI phantom can therefore be disposed in a simple fashion, such that the partial chamber is outside of the measuring plane.

In one particularly simple embodiment of the inventive MRI phantom, the volume of the partial chamber has the shape of an upright disc.

The main chamber may advantageously comprise an internal structure for generating spatially structured test images.

However, in an alternative embodiment, the main chamber is not structured. Detection of inhomogeneities is thereby particularly simple, since they show in an MRI image in the form of deviations from a uniform grey disc. Interference structures induced by inhomogeneity can occur during recording of phase images and be evaluated.

A marking may advantageously be provided for definition and control of the measuring position and/or locking the housing in the configuration. This may be a three-dimensional marking which can simultaneously be locked into a holder.

The liquid in the chamber of the MRI phantom is preferably water or an aqueous solution. The nuclei of these liquids to be excited using nuclear magnetic resonance are protons or deuterons.

Alternatively, the liquid in the chamber of the MRI phantom may comprise silicone oil or liquid hydrocarbons, and the nuclei to be excited using nuclear magnetic resonance are protons or $C^{13}$.

The housing of the MRI phantom is preferably made from transparent plastic material, in particular, from polycarbonates or polymethyl methacrylate (PMMA). The position of the gas bubble can thereby be controlled in a simple fashion.

The invention also concerns a method for determining the homogeneity of the magnetic field $B_0$ and/or the RF field $B_1$ and/or the linearity and/or intensity and/or scaling of the gradient fields in the volume under investigation of a described MRI configuration thereby using the above-described MRI phantom, characterized by the following steps:
  suitable orientation and turning of the MRI phantom, such that the gas bubble reaches the partial chamber;
  arranging the MRI phantom in a measurement orientation in the volume under investigation of the MRI configuration;
  imaging a partial volume of the volume under investigation, in particular, of a flat disc, using nuclear magnetic resonance, wherein the imaged partial volume comprises part of the main chamber but not the partial chamber.

The inventive method obviates refilling of MRI phantoms to avoid gas bubbles within the liquid in the MRI phantom housing. The number of measurements which cannot be utilized due to gas bubble artefacts is reduced and the efficiency of the phantom measurements is improved.

In an advantageous variant of the inventive method, the imaging partial volume has the shape of an upright disc. The advantages of the invention can thereby be utilized in a particularly advantageous fashion, since gas bubbles cause serious problems when such partial volumes are imaged using conventional methods.

With particular preference, the method steps are at least partially automated. Control of the position of the gas bubble during the measurement can be omitted.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

BRIEF DESCRIPTION OF THE DRAWING

FIG. 4b shows a top view of the barrier of FIG. 4a; and

FIG. 4c shows a perspective view of the MRI phantom of FIG. 4a.

DESCRIPTION OF THE PREFERRED EMBODIMENT

Figure 1:
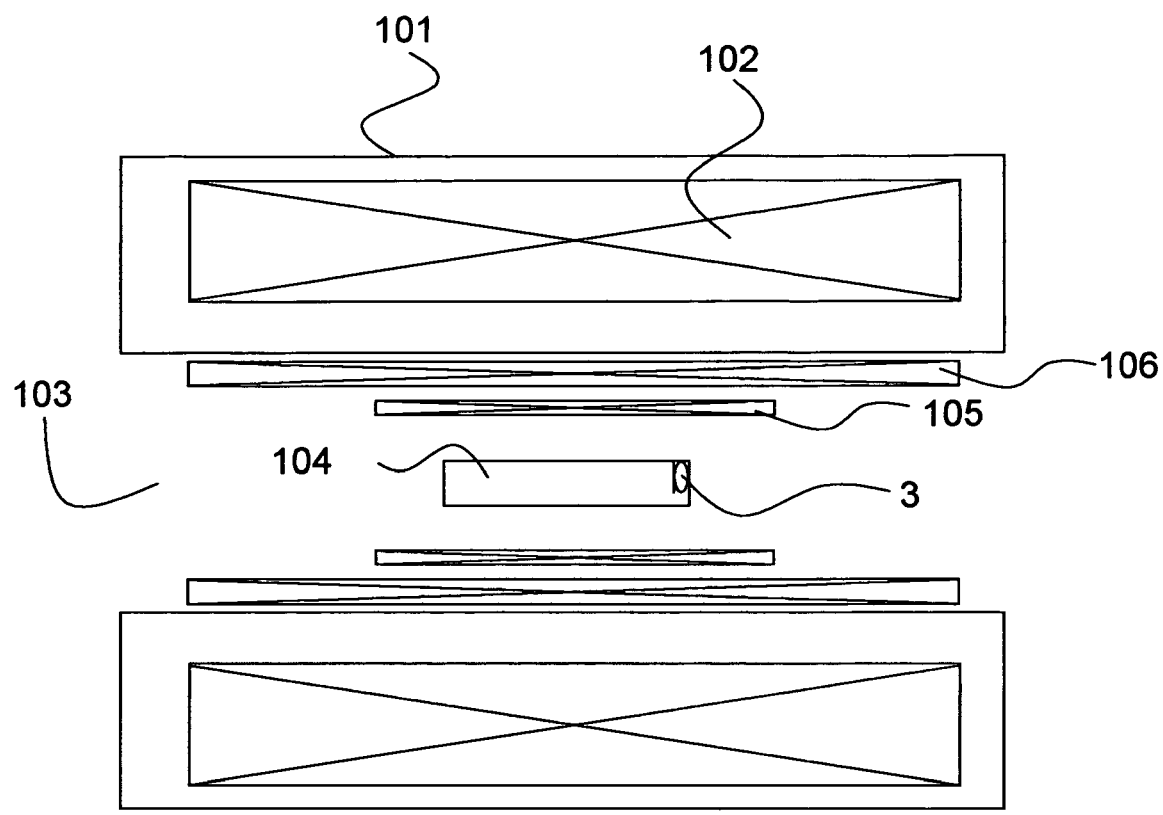
FIG. 1 shows a highly simplified sectional view of an inventive MRI configuration.

FIG. 1 shows a sectional view of an inventive MRI configuration with a magnet coil system 102 disposed in a cryostat 101. The inventive MRI configuration moreover comprises a radio frequency (RF) system 105 and a gradient system 106. An MRI phantom 104 is disposed in a volume under investigation located in a room temperature bore 103, which is filled with a liquid and in which a gas bubble 3 forms.

Figure 2A:
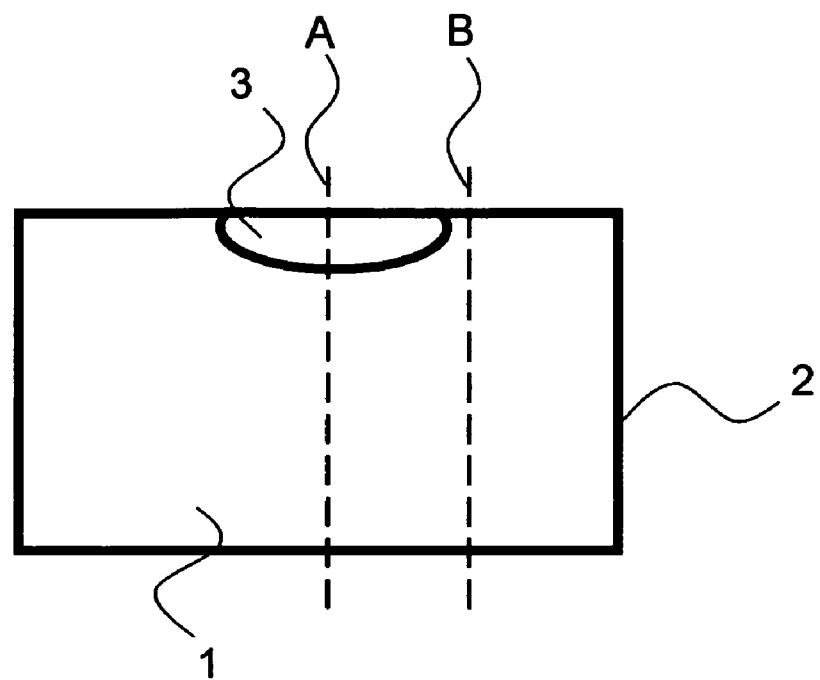
FIG. 2a shows a highly simplified sectional view of an MRI phantom in the form of a flat cylinder according to prior art, including gas bubble.

FIG. 2a shows a cross-section of an MRI phantom according to prior art. The MRI phantom comprises a chamber 1 which is delimited by a housing 2. The chamber 1 is filled with a liquid which is suited for nuclear magnetic resonance and in which a gas bubble 3 has formed. Due to the buoyancy of the gas bubble 3 in the liquid, the gas bubble 3 is located centrally at the upper edge of the chamber 1 in the resting MRI phantom of FIG. 2a. In an MRI recording through a central vertical measuring plane A, there is no signal in the region of the gas bubble 3, such that evaluations such as e.g. for signal homogeneity are not possible in the region of the gas bubble 3. MRI recordings through a peripheral vertical measuring plane B produce signals from the entire measuring region, but vibrations are generally generated through gradient switching, which can be transferred to the gas bubble 3 and therefore to the entire liquid and form artefacts in the MRI images.

Figure 2B:
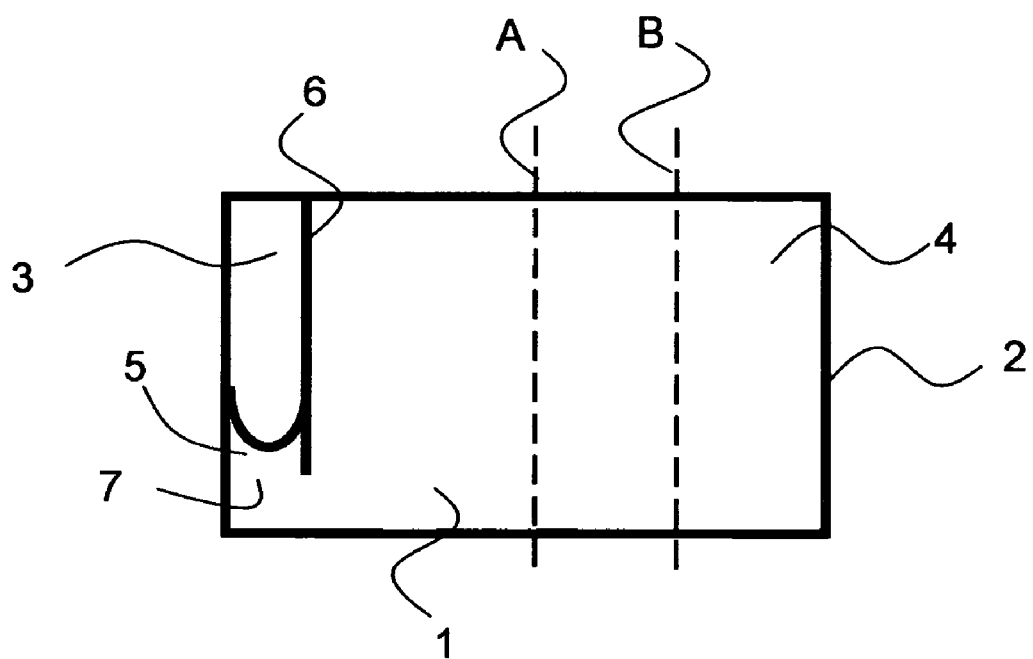
FIG. 2b shows a highly simplified sectional view of an embodiment of an inventive MRI phantom, including gas bubble.

FIG. 2b schematically shows the principle of an inventive MRI phantom. The chamber 1 is divided into a main chamber 4 and a partial chamber 5, which are separated by a barrier 6. The main chamber 4 and partial chamber 5 are connected via an opening 7. The partial chamber 5 is thereby dimensioned such that it can accommodate the gas bubble 3. The gas bubble 3 is inserted into the partial chamber 5 through changing the spatial orientation of the MRI phantom in the gravitation field, such that the gas bubble can be inserted from the main chamber 4 into the partial chamber 5 via the opening 7 due to its buoyancy. FIG. 2b shows the inventive MRI phantom in one measurement orientation. It is selected such that the gas bubble 3 is "caught" in the partial chamber 5 by the parts of the housing 2 forming the partial chamber 5, and the barrier 6.

In this manner, the gas bubble 3 can be kept away from the desired measuring planes A, B, such that there is a homogeneous signal-emitting substance in the measuring planes A, B. Moreover, the transfer of acoustical vibrations through the gas bubble 3 is considerably reduced through "catching" the gas bubble 3 in the partial chamber 5.

Figure 3:
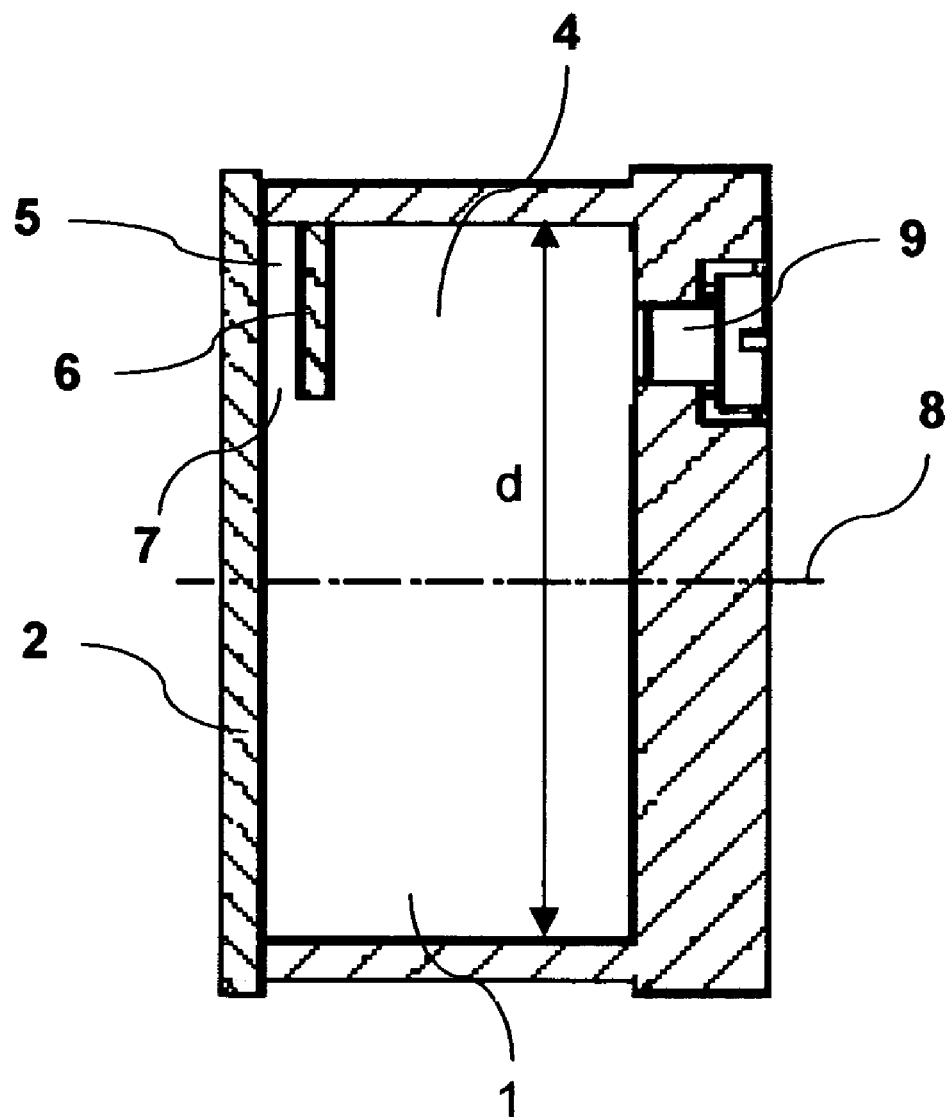
FIG. 3 shows a sectional view of a further embodiment of an inventive MRI phantom in the form of a flat cylinder.

FIG. 3 shows an advantageous embodiment of an inventive MRI phantom. The housing 2 has the shape of a flat cylinder with an axis 8 and is disposed in the volume under investigation of an MRI configuration such that the axis 8 is disposed perpendicularly to the measuring plane. The barrier 6 is designed as a wall which extends perpendicularly to the axis 8 and only over part of the cross-section d of the chamber 1. The inventive MRI phantom is shown in FIG. 3 in one measurement orientation, such that a gas bubble (not shown) which has previously entered through the opening 7 cannot escape during measurement but is kept between the parts of the housing 2 defining the partial chamber 5, and the barrier 6. The housing 2 has a fill-in device 9 for exchanging or refilling the liquid provided in the MRI phantom.

Figure 4A:
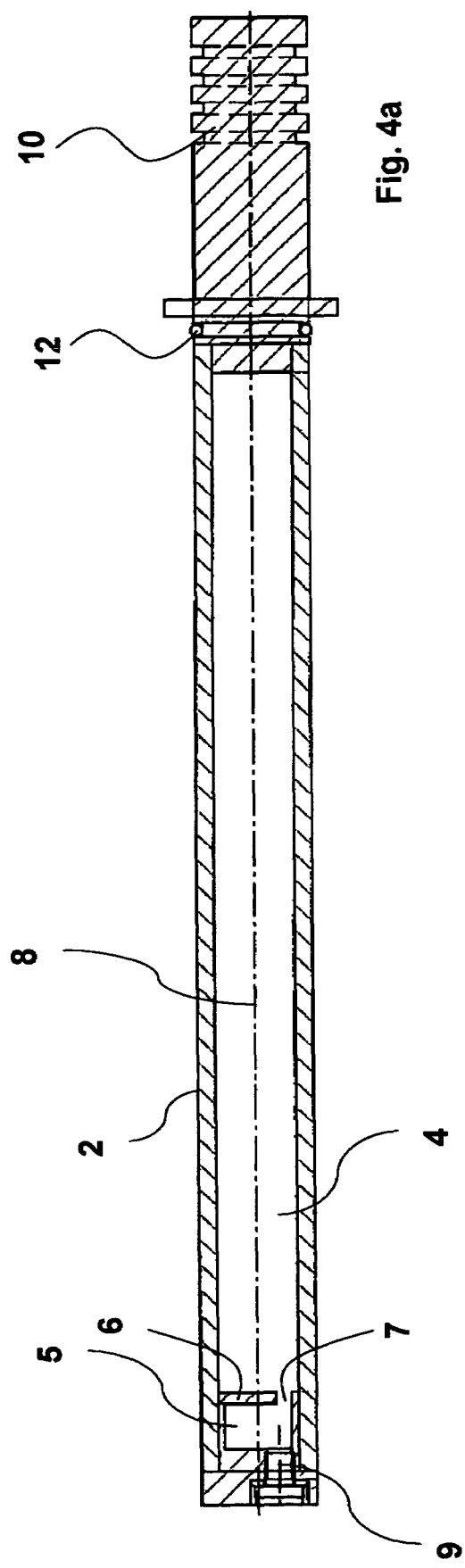
FIG. 4a shows a sectional view of a further embodiment of an inventive MRI phantom in the form of an elongate cylinder with a wall with an opening as a barrier.
Figure 4B:
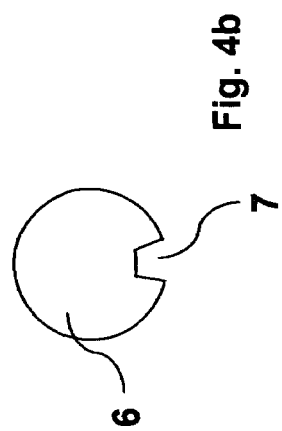
Figure 4C:
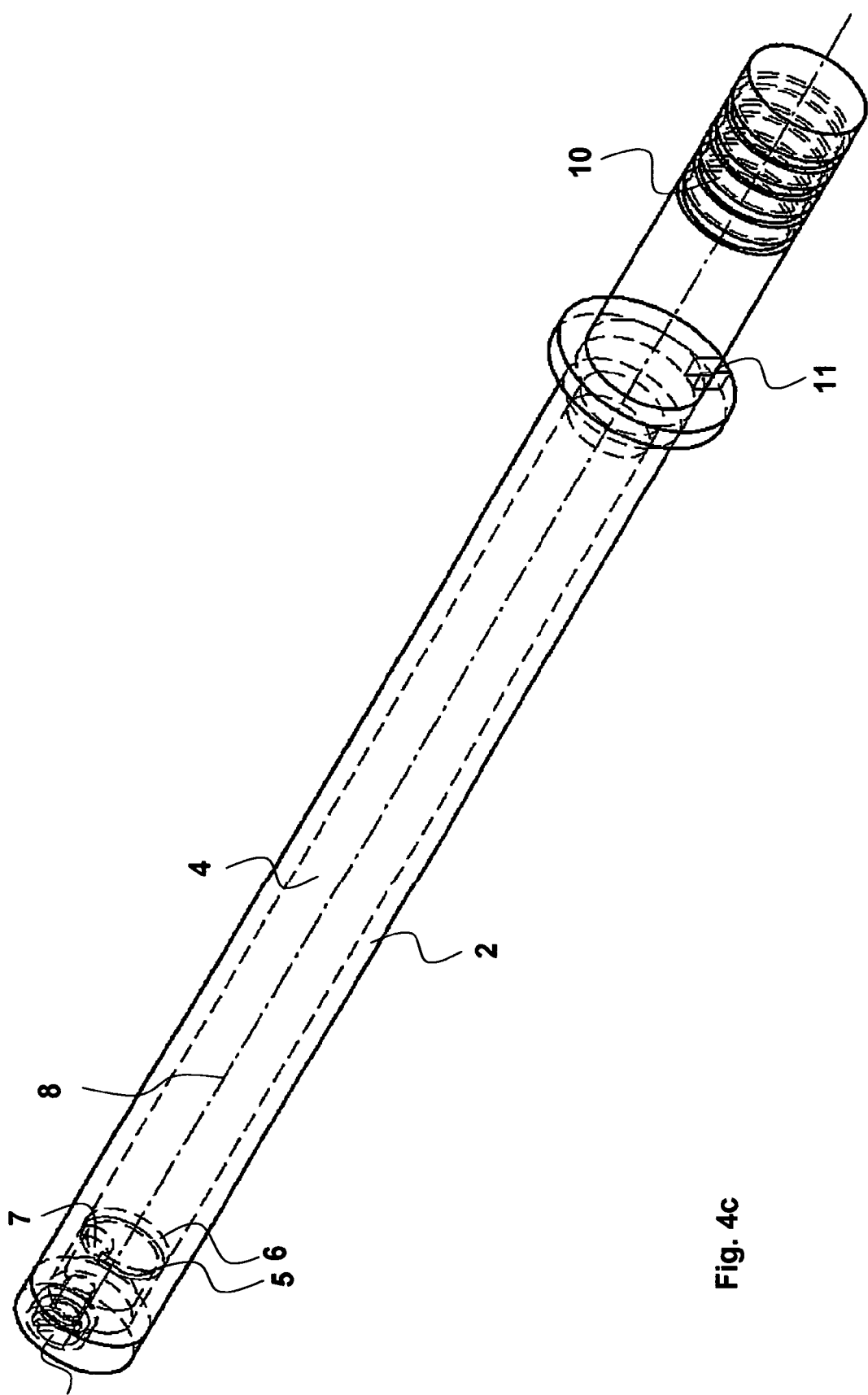

The embodiment of an inventive MRI phantom shown in FIGS. 4a and 4c comprises an elongate cylindrical main chamber 4 which is separated from the partial chamber 5 via a disc-shaped barrier 6 and is connected thereto via the opening 7. FIG. 4b shows a top view of the barrier 6 of the embodiment of the inventive MRI phantom of FIGS. 4a, 4c with opening 7. The main chamber 4 and the partial chamber 5 are axially offset from each other, wherein the barrier 6 is disposed relatively close to an axial end of the MRI phantom. The main chamber 5 thus extends over a large axial region, such that there are a plurality of measuring planes perpendicular to the axis 8, which contain a homogeneous MRI-compatible liquid. The MRI phantom can be introduced into the MRI configuration using a holding device 10 and be fixed using the O-ring 12. A marking 11 is moreover provided (FIG. 4b) which may control the measurement orientation of the MRI phantom or lock the housing 2 in the MRI configuration.

The shown embodiments of the inventive MRI phantoms each have cylindrical chambers. It is, however, also feasible to realize an inventive MRI configuration with an MRI phantom of a different shape, such as e.g. a hollow cylinder, a sphere etc.

The inventive MRI phantom is particularly advantageous for measurements of vertical planes, since gas bubbles cause the most problems in these measurements in conventional MRI phantoms. Even in sagittal recordings containing the phantom axis, the air bubble is kept away from the central region. However, the use of an MRI phantom in accordance with the present invention may also be advantageous for measuring horizontal planes, since the transfer of acoustical vibrations is largely suppressed such that more stable signals are also obtained in this case.

The artefacts in MRI recordings can be reduced with the inventive MRI configuration, at the same time facilitating handling of MRI phantoms.

LIST OF REFERENCE NUMERALS

A central measuring plane
B peripheral measuring plane
d cross-section
101 cryostat
102 magnet coil system
103 room temperature bore
104 MRI phantom
105 RF system
106 gradient system
1 chamber
2 housing
3 gas bubble
4 main chamber
5 partial chamber
6 barrier
7 opening
8 axis
9 fill-in device
10 holding device
11 marking
12 O-ring

I claim:

1. A nuclear magnetic resonance imaging (MRI) configuration comprising:
    a magnet system for generating a homogeneous magnetic field $B_0$ in a volume under investigation;
    a radio frequency (RF) system for generating an RF field $B_1$ in the volume under investigation or for detecting an RF field $B_1$, from the volume under investigation;
    a gradient system for temporarily superposing defined gradient fields on the magnetic field $B_0$; and
    an MRI phantom positioned in the volume under investigation to aid in determining a homogeneity of the magnetic field $B_0$ and/or the RF field $B_1$ and/or the linearity and/or intensity and/or scaling of the gradient fields in the volume under investigation, wherein the MRI phantom has a chamber disposed in a housing and filled with a liquid in which a gas bubble forms, wherein the liquid contains nuclei which have an NMR relaxation time $T_1$ of between 100 ms and 20 s, the chamber of the MRI phantom having a main chamber and a partial chamber, wherein the main chamber is delimited from the partial chamber such that the gas bubble can completely enter the partial chamber by changing a spatial orientation of the MRI phantom due to buoyancy of the gas bubble, and which remains in the partial chamber in a measurement orientation of the MRI phantom due to that buoyancy.

2. The MRI configuration of claim 1, wherein the magnet system comprises a cryostat with horizontal room temperature bore which houses the volume under investigation.

3. The MRI phantom of claim 1.

4. The MRI phantom of claim 3, wherein a barrier is provided in the chamber which partially delimits the partial chamber from the main chamber.

5. The MRI phantom of claim 4, wherein the barrier comprises a wall having an opening.

6. The MRI phantom of claim 4, wherein the barrier comprises a wall which extends over only part of a cross-section of the chamber.

7. The MRI phantom of claim 3, wherein the housing is cylindrical or circularly cylindrical.

8. The MRI phantom of claim 7, wherein the main chamber and the partial chamber are mutually offset in an axial direction.

9. The MRI phantom of claim 8, wherein the partial chamber is disposed at an axial end of the housing.

10. The MRI phantom of claim 3, wherein a volume of the partial chamber has a shape of a perpendicular disc.

11. The MRI phantom of claim 3, wherein the main chamber has an internal structure for generating spatially structured test images.

12. The MRI phantom of claim 3, wherein the main chamber is not structured.

13. The MRI phantom of claim 3, further comprising a marking to define and control the measuring position and/or to lock the housing.

14. The MRI phantom of claim 3, wherein the liquid contained in the chamber of the MRI phantom is water or an aqueous solution, and the nuclei to be excited using nuclear magnetic resonance are protons or deuterons.

15. The MRI phantom of claim 3, wherein the liquid in the chamber of the MRI phantom comprises silicone oil or liquid hydrocarbons, and the nuclei to be excited by nuclear magnetic resonance are protons or $C^{13}$.

16. The MRI phantom of claim 3, wherein the housing is produced from transparent plastic material, from polycarbonates, or from polymethyl methacrylate (PMMA).

17. A method for determining a homogeneity of a magnetic field $B_0$ and/or of an RF field $B_1$ and/or a linearity and/or intensity and/or scaling of gradient fields in a volume under investigation of the MRI configuration of claim 1, the method comprising the steps of:
   orientating and turning the MRI phantom, such that the gas bubble reaches the partial chamber;
   arranging the MRI phantom in a measurement orientation in the volume under investigation of the MRI configuration; and
   imaging a partial volume of the volume under investigation or imaging a flat disc partial volume using nuclear magnetic resonance, wherein the imaged partial volume comprises part of the main chamber but not the partial chamber.

18. The method of claim 17, wherein the partial volume to be imaged has the shape of an upright disc.

19. The method of claim 17, wherein the method steps are at least partially automated.

* * * * *